(12) United States Patent
Basker et al.

(10) Patent No.: US 10,297,448 B2
(45) Date of Patent: May 21, 2019

(54) SIGE FINS FORMED ON A SUBSTRATE

(71) Applicant: International Business Machines Corporation, Armonk, NY (US)

(72) Inventors: Veeraraghavan S. Basker, Schenectady, NY (US); Kangguo Cheng, Schenectady, NY (US); Theodorus E. Standaert, Clifton Park, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/954,581

(22) Filed: Nov. 30, 2015

(65) Prior Publication Data

US 2017/0154788 A1    Jun. 1, 2017

(51) Int. Cl.
*H01L 29/66* (2006.01)
*H01L 21/02* (2006.01)
*H01L 29/78* (2006.01)

(52) U.S. Cl.
CPC .. *H01L 21/02634* (2013.01); *H01L 21/02532* (2013.01); *H01L 29/66795* (2013.01); *H01L 29/785* (2013.01)

(58) Field of Classification Search
CPC ........... H01L 21/32105; H01L 21/3225; H01L 21/02634; H01L 29/785; H01L 29/66795; H01L 21/02532
USPC ....................................................... 257/622
See application file for complete search history.

(56) References Cited

U.S. PATENT DOCUMENTS

| | | | |
|---|---|---|---|
| 7,705,345 B2 | 4/2010 | Bedell et al. | |
| 8,048,723 B2* | 11/2011 | Chang | H01L 29/7851 257/192 |
| 8,703,565 B2* | 4/2014 | Chang | H01L 29/7853 438/283 |
| 8,951,870 B2 | 2/2015 | Basker et al. | |
| 8,957,477 B2 | 2/2015 | Chang et al. | |
| 8,975,125 B2 | 3/2015 | Adam et al. | |
| 8,994,072 B2 | 3/2015 | Kerber et al. | |
| 2009/0020786 A1* | 1/2009 | Lenoble | H01L 21/0337 257/213 |
| 2009/0278196 A1* | 11/2009 | Chang | H01L 21/823412 257/328 |

(Continued)

OTHER PUBLICATIONS

List of IBM Patents or Patent Applications Treated as Related Form: Veeraraghavan S. Basker, U.S. Appl. No. 16/358,227, filed Mar. 19, 2019; Veeraraghavan S. Basker, U.S. Appl. No. 16/358,240, filed Mar. 19, 2019.

*Primary Examiner* — Jarrett J Stark
(74) *Attorney, Agent, or Firm* — Sherman IP LLP; Kenneth L. Sherman; Steven Laut

(57) ABSTRACT

A semiconductor structure formed based on selectively forming a silicon-germanium (SiGe) layer on a substrate; forming at least one fin with a first width from the SiGe layer; forming at least one other fin with a second width from the substrate by etching the substrate to form the at least one other fin with the second width; and condensing the at least one fin with the first width and the at least one other fin with the second width by oxidizing the at least one fin with the first width and the at least one other fin with the second width by removing a portion of silicon (Si) from the at least one fin with the first width and the at least one other fin with the second width.

9 Claims, 8 Drawing Sheets

(56) References Cited

U.S. PATENT DOCUMENTS

| | | | |
|---|---|---|---|
| 2010/0248454 A1* | 9/2010 | Maszara | H01L 29/66795 438/478 |
| 2011/0147811 A1* | 6/2011 | Kavalieros | H01L 29/66795 257/288 |
| 2012/0025313 A1* | 2/2012 | Chang | H01L 29/1054 257/347 |
| 2014/0120678 A1 | 5/2014 | Shinriki et al. | |
| 2014/0264600 A1* | 9/2014 | Adam | H01L 29/785 257/347 |
| 2015/0108572 A1 | 4/2015 | Cheng et al. | |
| 2015/0318219 A1* | 11/2015 | Cappellani | B82Y 10/00 438/157 |
| 2017/0005002 A1* | 1/2017 | Ching | H01L 21/823412 |

* cited by examiner

SIGE FINS FORMED ON A SUBSTRATE

BACKGROUND

Embodiments of the invention relate to semiconductor structures, in particular, for defect-free silicon-germanium (SiGe)-on-insulator fins formed on a bulk silicon (Si) substrate and a method of manufacturing the same.

SiGe Fin field-effect transistor (FinFET) semiconductor structures are a viable option for continued scaling of FinFET to 10 nm and beyond, however, there are two major issues with SiGe fin fabrication. SiGe fins formed by growing a SiGe layer on a bulk Si substrate is limited by the so-called critical thickness. When SiGe is grown on Si, beyond the critical thickness, dislocations start to generate in SiGe films, resulting in defective SiGe fins. Isolation of SiGe fin from the bulk Si is not trivial. N-type dopants (e.g., phosphorus or arsenic) are used for a punchthrough stopping region under SiGe fins to suppress source/drain punchthrough. Unfortunately, N-type dopants have a greater diffusion rate in SiGe than in Si, resulting in undesired encroachment of punchthrough Si (PTS) dopants into SiGe channel, resulting in degradation of device performance and increase of device variability.

SUMMARY

Embodiments of the invention relate to semiconductor structures, in particular, for defect-free silicon-germanium (SiGe)-on-insulator fins formed on a bulk silicon (Si) substrate and a method of manufacturing the same. In one embodiment, a semiconductor structure comprises at least one fin with a first width and an oxide layer isolating the at least one fin with a first width from a substrate. The oxide layer is formed based on oxidizing a top surface of the substrate and at least one other fin with a second width. The at least one other fin with a second width is formed based on etching the at least one other fin with a second width from the substrate. Further, the at least one fin with a first width is formed based on etching the at least one fin with a first width from a SiGe layer, where the SiGe layer resides on the substrate. Moreover, a height of the at least one fin with the first width is reduced after oxidizing and the first width is reduced after oxidizing. A percentage of Ge in the at least one fin with the reduced first width is greater than a percentage of Ge in the SiGe layer. The first width of the at least one fin is greater than the second width of the at least one other fin. A portion of Si from the at least one fin with the first width and the at least one other fin with the second width as a result of forming the oxide layer.

In one embodiment, a method includes selectively forming a silicon-germanium (SiGe) layer on a substrate by epitaxially growing the SiGe layer on a top surface of the substrate. Then forming at least one fin with a first width from the SiGe layer by forming a masking layer on a top surface of the SiGe layer, etching the at least one fin with the first width, and forming a spacer layer on the at least one fin with the first width. Next, forming at least one other fin with a second width from the substrate by etching the substrate to form the at least one other fin with the second width, wherein the second width is less than the first width, and selectively removing the spacer layer from the at least one fin with the first width. Finally, condensing the at least one fin with the first width and the at least one other fin with the second width by oxidizing the at least one fin with the first width and the at least one other fin with the second width by removing a portion of Si from the at least one fin with the first width and the at least one other fin with the second width.

In this method, oxidizing the at least one other fin with the second width creates an oxide layer isolating the at least one fin with the first width from the substrate. Further, a height of the at least one fin with the first width is reduced after oxidizing. Moreover, the first width is reduced after oxidizing; and a percentage of Ge in the at least one fin with the reduced first width is greater than a percentage of Ge in the SiGe layer.

These and other features, aspects and advantages of the present invention will become understood with reference to the following description, appended claims and accompanying figures.

DETAILED DESCRIPTION

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As used herein, a "lengthwise" element is an element that extends along a corresponding lengthwise direction, and a "widthwise" element is an element that extends along a corresponding widthwise direction.

Figure 1:
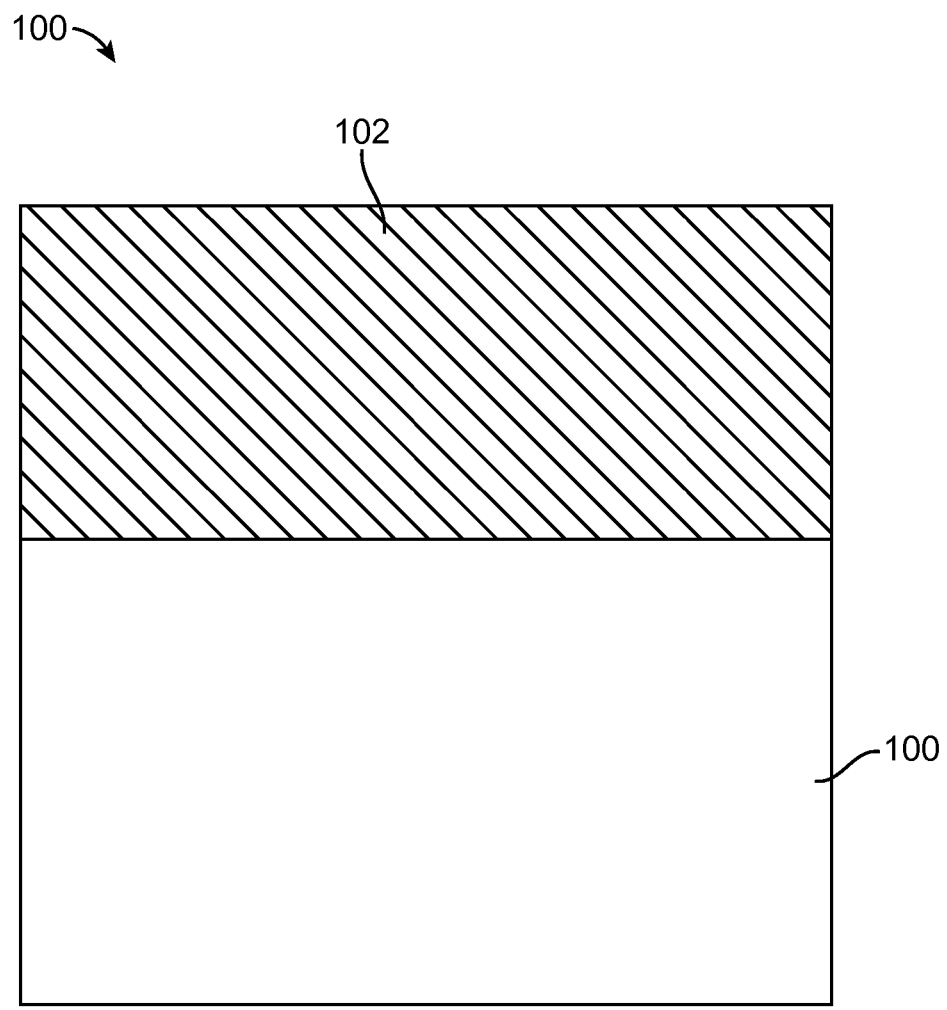
FIG. 1 is a cross-sectional view of an exemplary semiconductor structure with a silicon-germanium (SiGe) layer formed on a substrate, according to one embodiment.

FIG. 1 is a cross-sectional view of an exemplary semiconductor structure 100 with a silicon-germanium (SiGe)

layer 102 formed on a substrate 100, according to one embodiment of the present invention. In one embodiment, the substrate 100 is a commercial silicon (Si) substrate atop which the SiGe layer 102 is formed. In one embodiment, the SiGe layer 102 is epitaxially grown atop the substrate 100. In one embodiment, the SiGe layer 102 has a relatively low Ge percentage (e.g., 5-15 percent) as compared to the overall makeup of the SiGe layer 102. The low Ge percentage in the SiGe layer 102 allows for the manufacture of taller SiGe fins without defects. Further, the SiGe layer 102 is taller than the desired SiGe fins (112, FIG. 6), taking into account the height and width reduction in the condensing step (208, FIG. 8). In one embodiment, the SiGe layer may be gown to a height of at least 50 nm. It is appreciated that the taller the SiGe layer, the taller the resultant SiGe fins can be manufactured.

Figure 2:
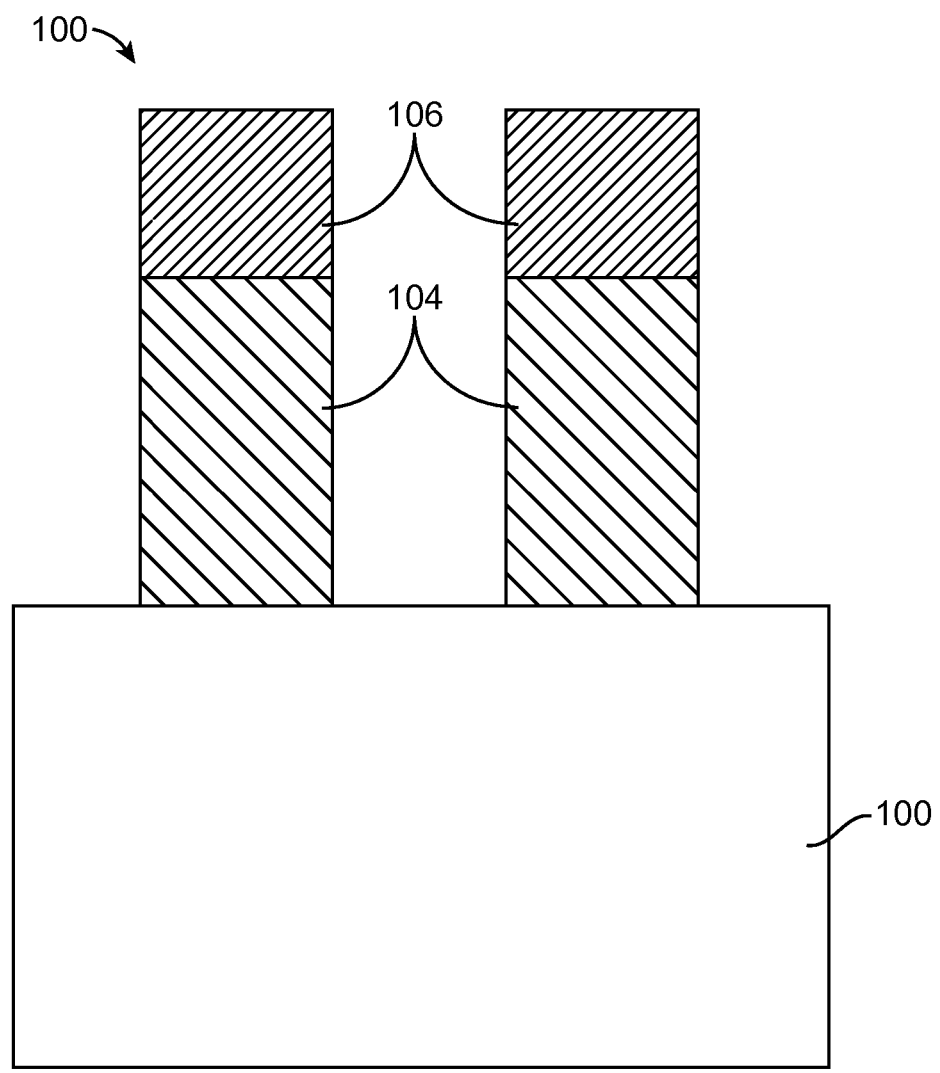
FIG. 2 is a cross-sectional view of a result of the exemplary structure of FIG. 1 after selective formation of at least one SiGe fin with a first width from the SiGe layer, according to an embodiment.

FIG. 2 is a cross-sectional view of a result of the exemplary structure 100 of FIG. 1 after selective formation of at least one SiGe fin 104 with a first width from the SiGe layer 102 (FIG. 1), according to an embodiment of the present invention. In this embodiment, prior to formation of the SiGe fins 104 a hardmask layer 106 is applied and/or formed on a top surface of the SiGe layer 102 (FIG. 1). In one embodiment, the hardmask layer is silicon nitride and applied in the conventional spacer image and transfer (STI) process. The SiGe fins 104 are formed in a conventional process (e.g., dry etching, wet etching, etc.). At this point in the process, the SiGe fins 104 have a first width which is greater than the width of the SiGe fins after the condensing/oxidation step (208, FIG. 8). In one embodiment, the first width of the SiGe fins 104 is 20 nm, where the target/final width may be 8 nm.

Figure 3:
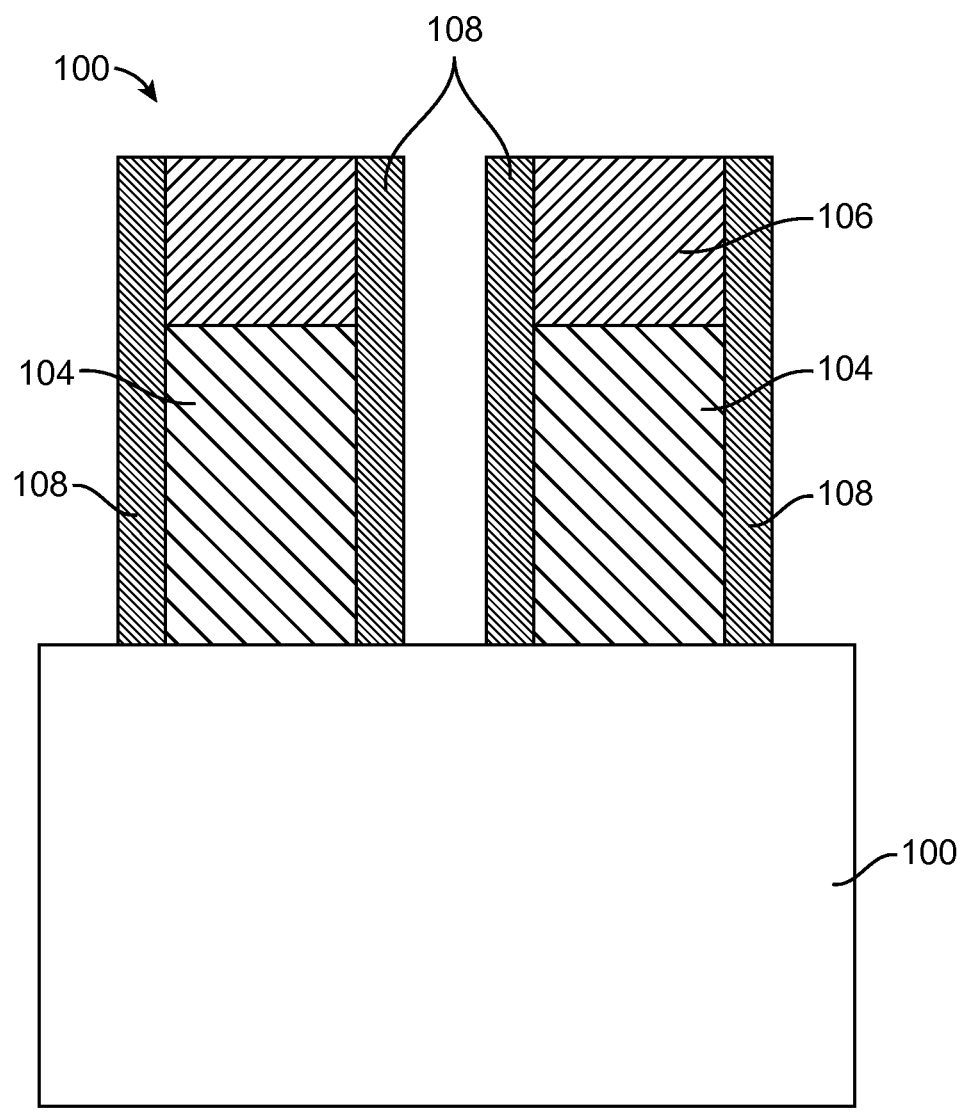
FIG. 3 is a cross-sectional view of a result of the exemplary structure of FIG. 2 after forming a spacer layer, according to an embodiment.

FIG. 3 is a cross-sectional view of a result of the exemplary structure 100 of FIG. 2 after forming a spacer layer 108, according to an embodiment of the present invention. In this embodiment, the spacer layer 108 is applied only to the sidewalls of the SiGe fins 104. The spacer layer 108 may be made up of the same material as the hardmask 106 (e.g., silicon-nitride) or distinct from the hardmask 106 (e.g., oxide). In one embodiment, the thickness of the spacer layer 108 is less than the thickness of the hardmask layer 106 to allow for subsequent removal (e.g., etching) of the spacer layer 106 from the SiGe fins 104 while maintaining the hardmask layer 106.

Figure 4:
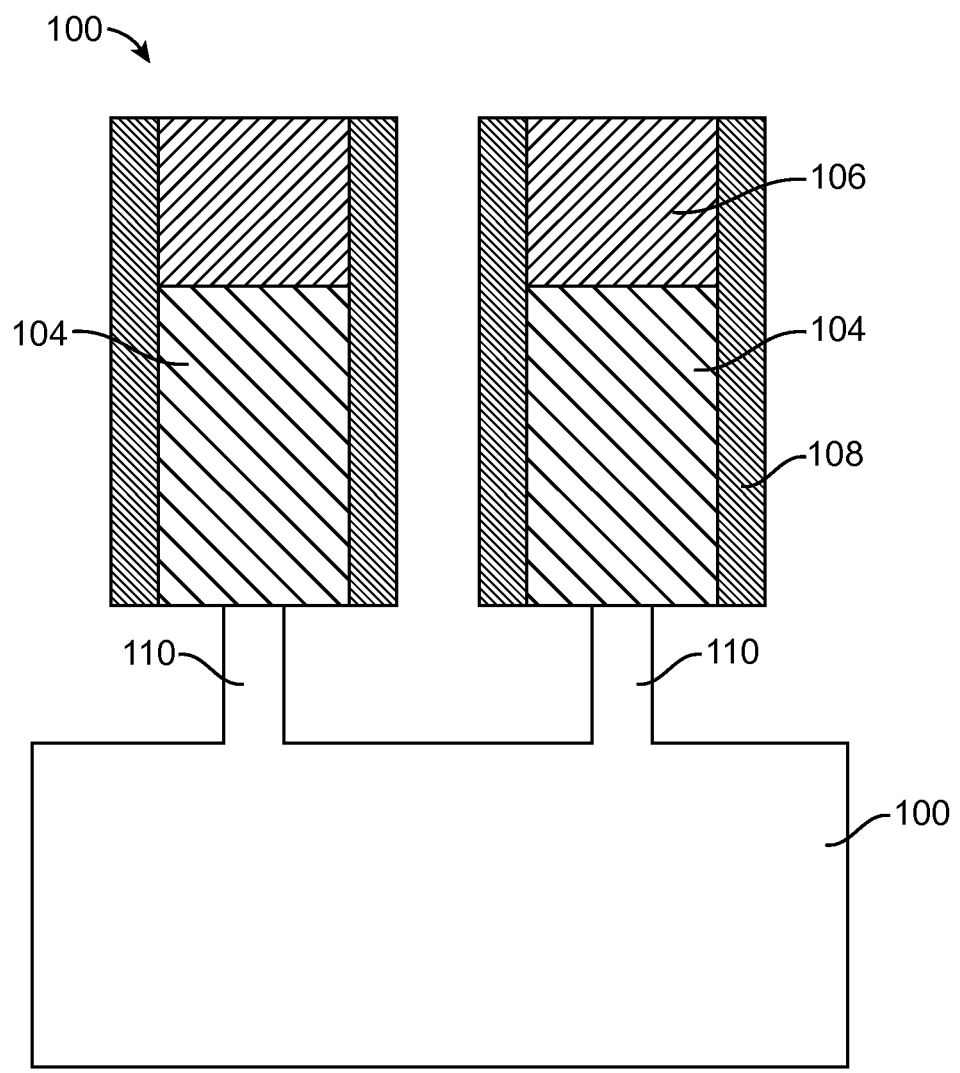
FIG. 4 is a cross-sectional view of the result of the exemplary structure of FIG. 3 after formation of at least one silicon (Si) fin with a second width from the substrate, according to an embodiment.

FIG. 4 is a cross-sectional view of the result of the exemplary structure 100 of FIG. 3 after formation of at least one Si fin 110 with a second width from the substrate 100, according to an embodiment of the present invention. In this embodiment, only portions of the substrate 100 is selective removed (e.g., dry etching, wet etching, etc.) to form Si fins 110. It is appreciated that for each SiGe fin 104, there is a corresponding Si fin 110. Further, the Si fins 110 have a width which is less than the width of the SiGe fins 104. This allows for complete oxidation of the Si fins 110 without complete oxidation of the SiGe fins 104 at the condensing/oxidation step (208, FIG. 8). In one embodiment the Si fins 104 have a width of 10 nm.

Figure 5:
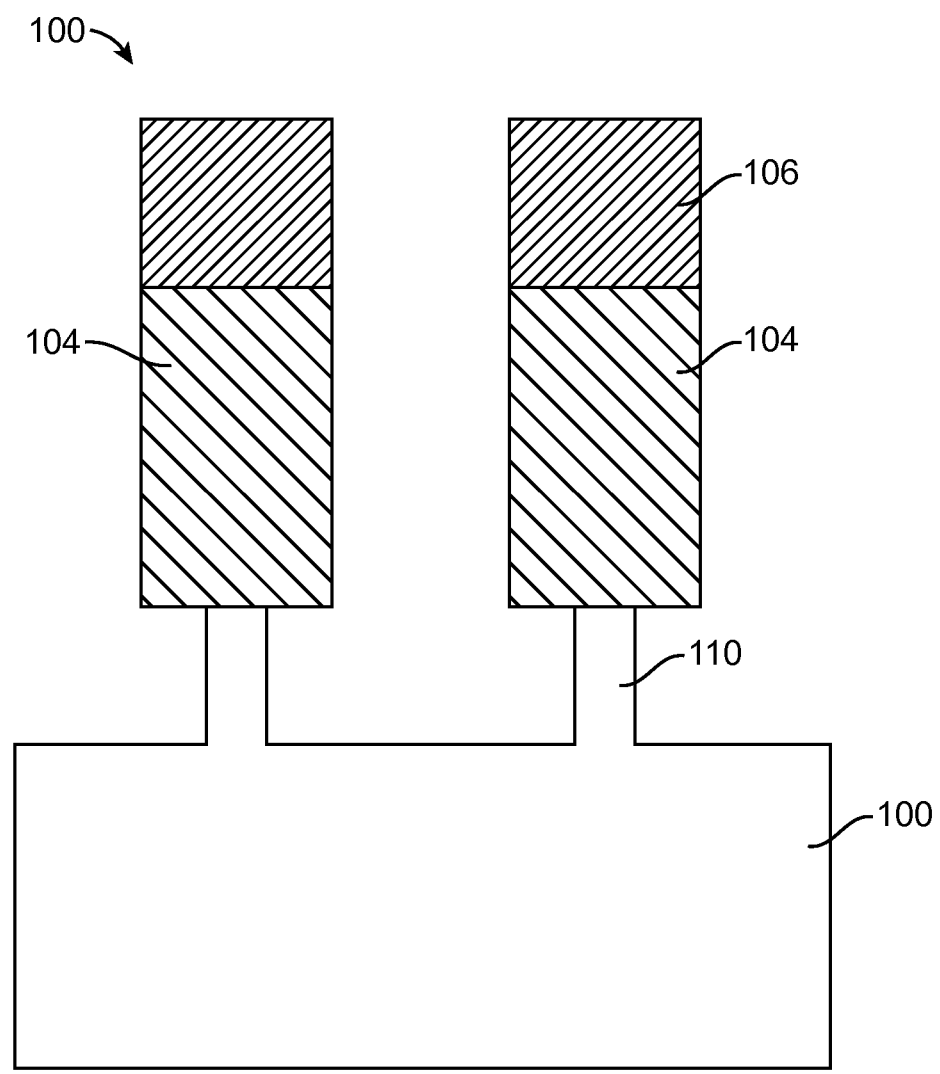
FIG. 5 is a cross-sectional view of the result of the exemplary structure of FIG. 4 after selectively removing the spacer layer from the SiGe fins, according to an embodiment.

FIG. 5 is a cross-sectional view of the result of the exemplary structure 100 of FIG. 4 after selectively removing the spacer layer 108 from the SiGe fins 104, according to an embodiment of the present invention. In one embodiment, the spacer layer 108 (FIG. 4) is selectively removed from the structure 100 by etching (e.g., wet etching, dry etching, time etching, etc.).

Figure 6:
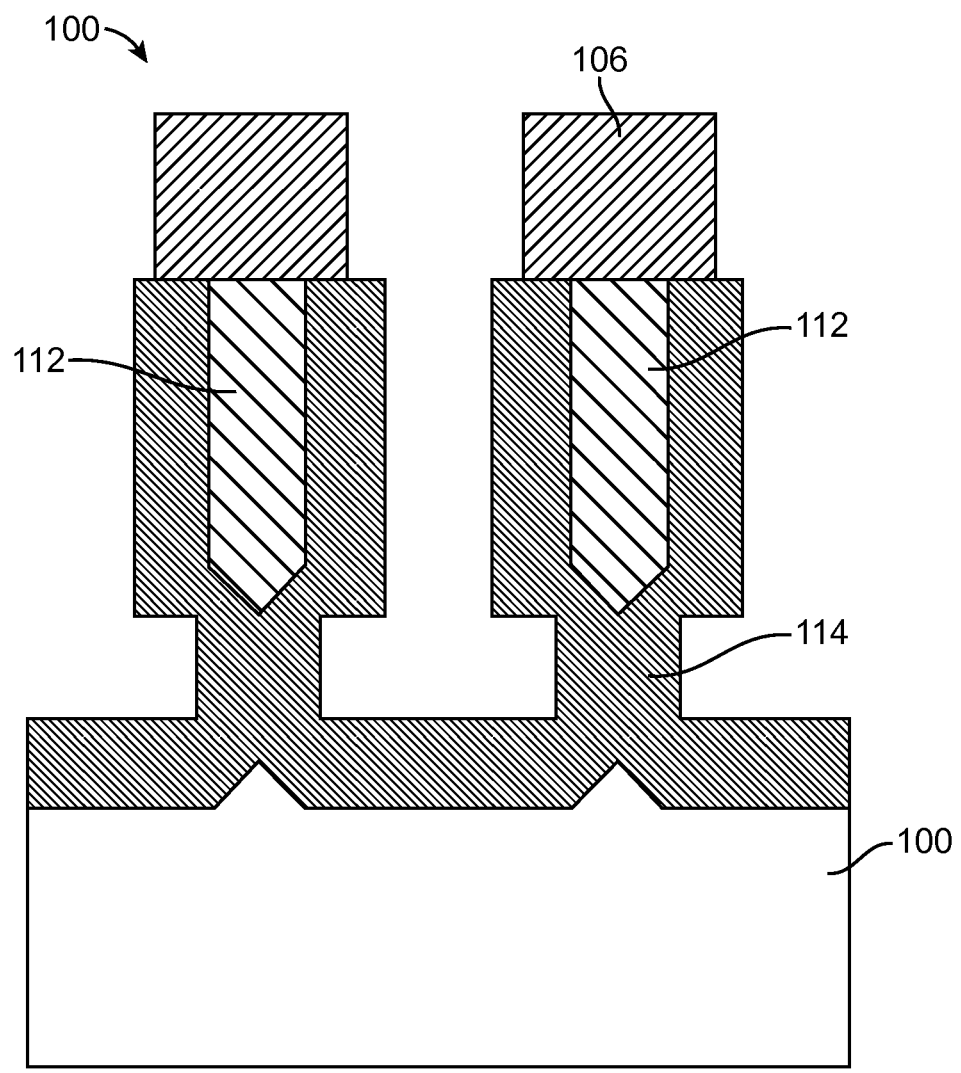
FIG. 6 is a cross-sectional view of the result of the exemplary structure of FIG. 5 after condensing the at least one SiGe fin with the first width and the at least one Si fin with the second width, according to an embodiment.

FIG. 6 is a cross-sectional view of the result of the exemplary structure 100 of FIG. 5 after condensing the at least one SiGe fin 104 with the first width and the at least one Si fin 110 with the second width, according to one embodiment of the present invention. In this embodiment, condensing the structure 100 includes performing an oxidation to each of the SiGe fins 104, the Si fins 110 (FIG. 5) and the top surface of the substrate 100. In one embodiment, the Si fins 110 are completely oxidized by the condensing/oxidization process, forming an oxide layer (e.g. barrier) between the SiGe fins 104 and the substrate 100. Oxidization of the SiGe fins 104 to remove a portion of the Si from the SiGe fins results in SiGe fins 112 with a higher Ge percentage as compared to the percentage of Ge in the SiGe layer 102 (FIG. 1). Oxidization also has the effect of condensing the width of the SiGe fins. In this embodiment, the oxide layer (e.g., barrier) 114 isolates the SiGe fins 112 from the substrate 100. The result is that in this configuration, there is no need to employ a punchthrough, thus reducing the risk of leakage into the substrate.

For example, with SiGe fins 104 having a 20 nm width and the Si fins 110 having a 10 nm width, a 20 nm oxidization of the SiGe fins 104 and Si fins 110 will result in fully oxidized Si fins oxidize 12 nm oxidization of the SiGe fin 112. As a result, the percentage of Ge in the oxidized SiGe fins 112 is higher than the percentage of Ge to Si in the SiGe layer 102 (e.g., 25 percent compared to 10 percent). Moreover, the higher Ge SiGe fins 112 have been condensed in width to their target width (8 nm in this example).

Figure 7:
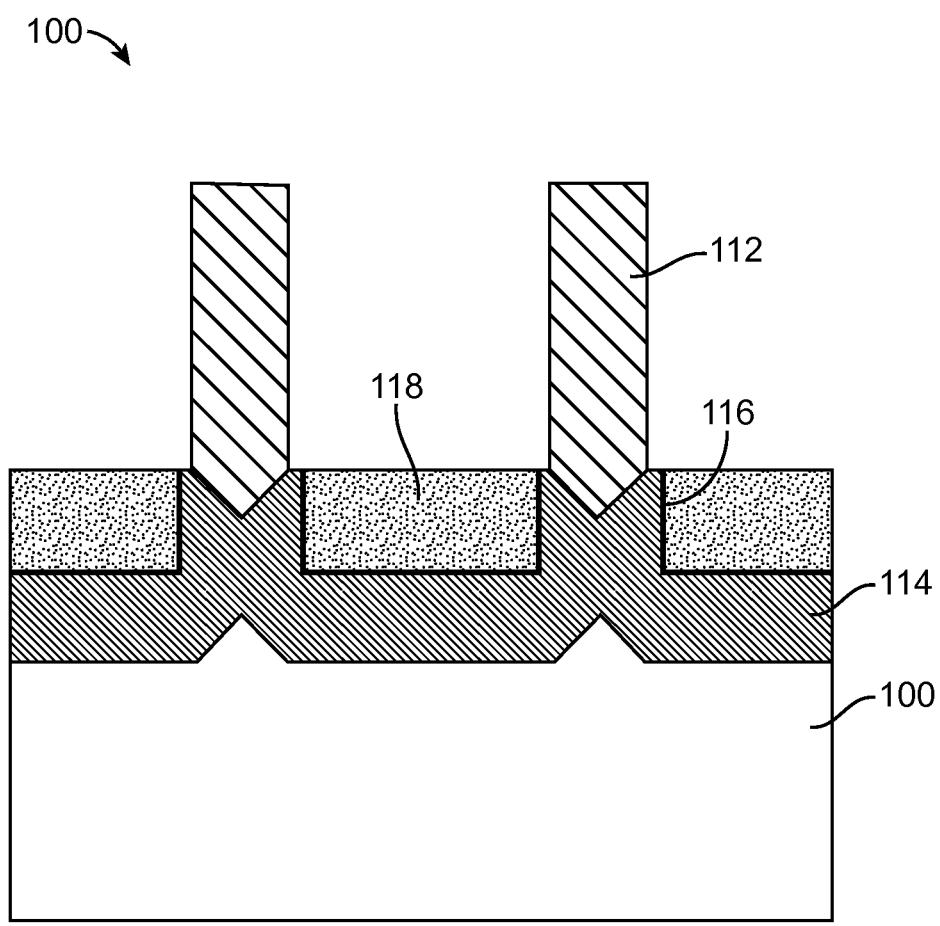
FIG. 7 is a cross-sectional view of the result of the exemplary structure of FIG. 6 after selectively removing an oxide layer from the at least one SiGe fin with a first width, according to an embodiment.

FIG. 7 is a cross-sectional view of the result of the exemplary structure 100 of FIG. 6 after selectively removing an oxide layer 114 (FIG. 6) from the at least one SiGe fin with a first width (112), according to one embodiment of the present invention. In this embodiment, the oxide layer 114 (FIG. 6) is selectively removed from the side surfaces of the SiGe fins 102 having a higher concentration of Ge 112. Here, the oxide layer 114 may be thermal oxide. Further, a nitride liner 116 may be deposited on the surface of the oxide layer 114 and then a flowable oxide layer 118 may be deposited on the nitride liner 116. It will be appreciated that complete Fin field-effect transistor (FinFET) fabrication is not detailed in FIG. 7.

Figure 8:
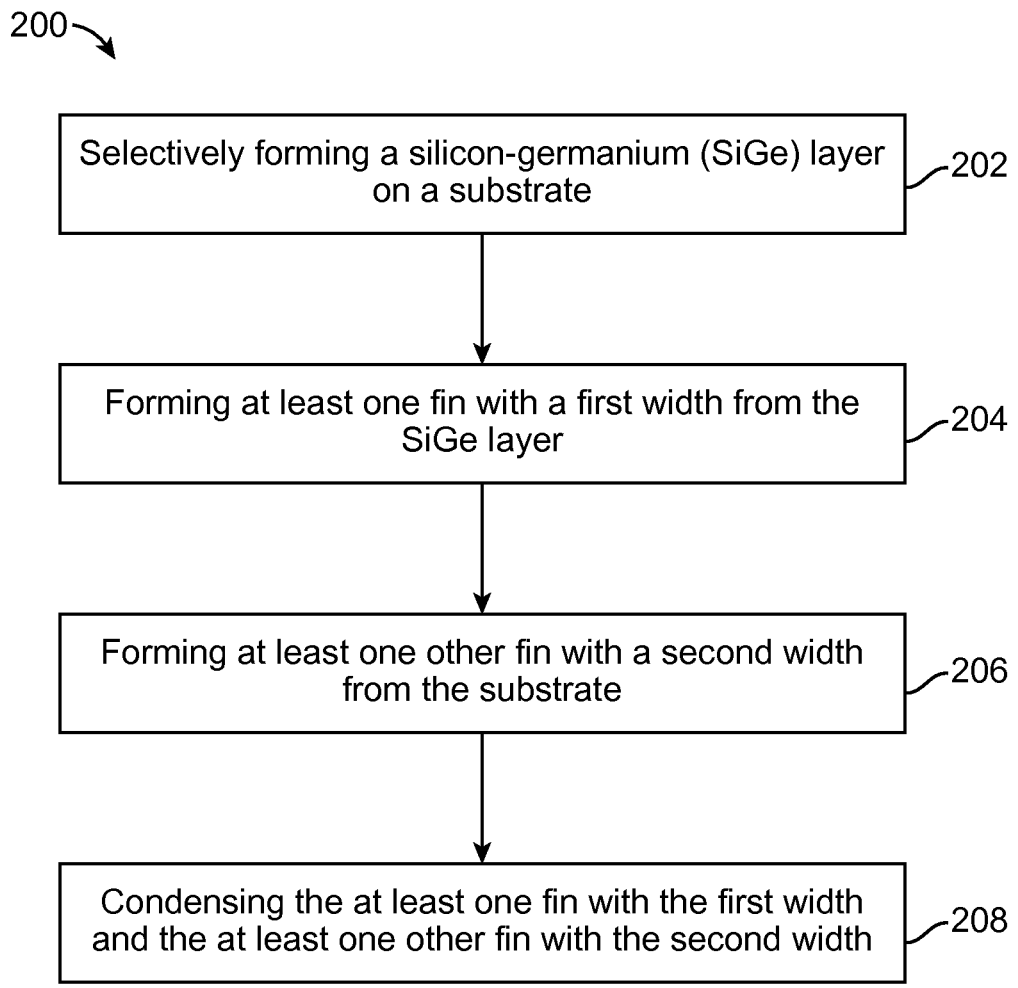
FIG. 8 illustrates a block diagram for a process for forming defect-free silicon-germanium (SiGe)-on-insulator fins on a bulk Si substrate, according to one embodiment.

FIG. 8 illustrates a block diagram for a process 200 for forming defect-free silicon-germanium (SiGe)-on-insulator fins 112 (FIG. 7) on a bulk silicon (Si) substrate 100 (FIG. 7), according to one embodiment of the present invention. In one embodiment, in block 202 a SiGe layer is formed on a top surface of a substrate. The SiGe layer may be formed by epitaxially growing the SiGe on a Si substrate. In one embodiment, the SiGe layer will have a percentage of Ge of between 5-15% compared to the percentage of Si. Moreover, the SiGe layer will have an optimal height greater than a height of formed SiGe fins to account for condensing of the fin in block 208.

In one embodiment, in block 204 formation of SiGe fins may comprise forming a hardmask layer (106, FIG. 2) on a top surface of the SiGe layer (102, FIG. 2), then etching the SiGe fins from the SiGe layer. In one embodiment, the hardmask layer is silicon nitride and applied in the conventional spacer image and transfer (STI) process. The resultant SiGe fins have a first width which is greater than the width of the SiGe fins after the condensing step 208. For example, with a target width of 8 nm, the SiGe fins formed in block 204 may have a thickness of 20 nm.

In one embodiment of the present invention, block 206 comprises applying a spacer layer 108 (FIG. 4) to the side surfaces of the SiGe fins 104 (FIG. 4). Thereafter, the Si fins 110 (FIG. 4) are formed (e.g., etched) from the substrate 100 (FIG. 4). In one embodiment, after forming the Si fins 110, the spacer layer 108 is removed from the SiGe fins 104 (FIG. 5). In one embodiment, the spacer layer 108 (FIG. 4) is selectively removed from the structure 100 by etching (e.g., wet etching, dry etching, time etching, etc.).

In one embodiment of the present invention, step 208 involves condensing the SiGe fins 104 (FIG. 6) by means of oxidizing the SiGe fins 104, Si fins 110 and the top surface of the substrate 100 (FIG. 5). By oxidizing Si from the SiGe fins, the resultant fin has a higher percentage of Ge as compared to the percentage of Ge in the SiGe layer. Further, the resultant fin has a width more narrow than the fabricated (pre-oxidized) SiGe fins in block 204.

Moreover, in one embodiment of the present invention, as a result of condensing the SiGe fins and Si fins in block 208, the Si is fully oxidized from the Si fins, resulting in the formation of an oxide layer 114 (FIG. 6) isolating the SiGe fins from the substrate.

In one embodiment of the present invention, by forming the Si fins 204, the Si fins have a width which is less than the width of the SiGe fins 104 (FIG. 5) to allow for complete oxidation of the Si fins 110 without complete oxidation of the SiGe fins 104 during condensing 208.

The exemplary methods and techniques described herein may be used in the fabrication of IC chips. In one embodiment, the IC chips may be distributed by a fabricator in raw wafer form (i.e., as a single wafer that has multiple unpackaged IC chips), as a bare die, or in a packaged form. In the latter case, the IC chip is mounted in a single IC chip package (e.g., a plastic carrier with leads that are affixed to a motherboard or other higher level carrier) or in a multiIC chip package (e.g., a ceramic carrier that has either or both surface interconnections or buried interconnections). The IC chip is then integrated with other IC chips, discrete circuit elements and/or other signal processing devices as part of either (a) an intermediate product, such as a motherboard, or (b) an end product, such as microprocessors, smart phones, mobile phones, cellular handsets, set-top boxes, DVD recorders and players, automotive navigation, printers and peripherals, networking and telecom equipment, gaming systems, toys and digital cameras, as non-limiting examples. One or more embodiments, may be applied in any of various highly integrated semiconductor devices.

Unless described otherwise or in addition to that described herein, "depositing" may include any now known or later developed techniques appropriate for the material to be deposited, including, but not limited to: CVD, LPCVD, PECVD, semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, PVD, ALD, chemical oxidation, MBE, plating or evaporation. Any references to "poly" or "poly silicon" should be understood to refer to polycrystalline silicon.

References herein to terms such as "vertical", "horizontal," etc. are made by way of example, and not by way of limitation, to establish a frame of reference. The term "horizontal" as used herein is defined as a plane parallel to the conventional plane or surface of the substrate, regardless of the actual spatial orientation of the semiconductor substrate. The term "vertical" refers to a direction perpendicular to the horizontal, as just defined. Terms, such as "on," "above," "below," "side" (as in "sidewall"), "higher," "lower," "over," "beneath" and "under," are defined with respect to the horizontal plane. It is understood that various other frames of reference may be employed for describing one or more embodiments without departing from the spirit and scope of the one or more embodiments.

References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of 35 U.S.C. section 112, sixth paragraph, unless the element is expressly recited using the phrase "means for" or "step for."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, materials, and/or components, but do not preclude the presence or addition of one or more other features, steps, operations, elements, materials, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
    selectively forming a silicon-germanium (SiGe) layer on a substrate;
    forming at least one SiGe fin with a first width from the SiGe layer;
    forming at least one Si fin with a second width from an upper portion of the substrate;
    oxidizing the at least one SiGe fin with the first width, the at least one Si fin with the second width and a surface of the substrate below the at least one Si fin, wherein the first width of the at least one SiGe fin is condensed in width to a target width, the at least one Si fin is completely oxidized forming an oxide layer between the at least one SiGe fin and the substrate, the oxidizing resulting in a higher percentage of Ge in the at least one SiGe fin with the target width than a percentage of Ge in the SiGe layer, the target width is less than the second width, and the second width is less than the first width; and
    selectively removing the oxide layer from side surfaces of the at least one SiGe fin.

2. The method of claim 1, further comprising:
    depositing a nitride liner on a surface of a remaining portion of the oxide layer; and
    depositing a flowable oxide layer on the nitride layer, wherein forming the SiGe layer comprises epitaxially growing the SiGe layer on a top surface of the substrate.

3. The method of claim 1, wherein forming the at least one SiGe fin with a first width comprises:
   forming a masking layer on a top surface of the SiGe layer; and
   etching the at least one SiGe fin with the first width.

4. The method of claim 3, further comprising forming a spacer layer on the at least one SiGe fin with the first width.

5. The method of claim 4, wherein forming the at least one Si fin with the second width comprises:
   etching the substrate to form the at least one Si fin with the second width; and
   selectively removing the spacer layer from the at least one SiGe fin with the first width.

6. The method of claim 1, wherein oxidizing comprises removing a portion of Si from the at least one SiGe fin with the first width and the at least one Si fin with the second width.

7. The method of claim 6, wherein oxidizing the at least one Si fin with the second width creates an oxide layer isolating the at least one SiGe fin with the target width from the substrate.

8. The method of claim 6, wherein a height of the at least one SiGe fin with the target width is reduced after oxidizing.

9. The method of claim 1, wherein:
   the at least one Si fin is formed directly below the at least on SiGe fin; and
   the oxidizing results without a need for employing a punchthrough stopping region under the at least one SiGe fin to suppress source/drain punchthrough.

* * * * *